United States Patent
Liu et al.

(10) Patent No.: US 9,355,820 B2
(45) Date of Patent: May 31, 2016

(54) METHODS FOR REMOVING CARBON CONTAINING FILMS

(71) Applicant: APPLIED MATERIALS, INC., Santa Clara, CA (US)

(72) Inventors: Wei Liu, San Jose, CA (US); Naomi Yoshida, Sunnyvale, CA (US); Mandar Balasaheb Pandit, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/484,397

(22) Filed: Sep. 12, 2014

(65) Prior Publication Data

US 2015/0072526 A1    Mar. 12, 2015

Related U.S. Application Data

(60) Provisional application No. 61/877,062, filed on Sep. 12, 2013.

(51) Int. Cl.

| | |
|---|---|
| *H01L 21/302* | (2006.01) |
| *H01L 21/461* | (2006.01) |
| *B44C 1/22* | (2006.01) |
| *C03C 15/00* | (2006.01) |
| *C03C 25/68* | (2006.01) |
| *C23F 1/00* | (2006.01) |
| *H01J 37/32* | (2006.01) |
| *H01L 21/311* | (2006.01) |
| *H01L 21/3065* | (2006.01) |
| *H01L 21/3213* | (2006.01) |
| *H01L 21/8238* | (2006.01) |

(52) U.S. Cl.
CPC ........... *H01J 37/321* (2013.01); *H01L 21/3065* (2013.01); *H01L 21/31122* (2013.01); *H01L 21/31138* (2013.01); *H01L 21/31144* (2013.01); *H01L 21/32139* (2013.01); *H01L 21/32137* (2013.01); *H01L 21/823828* (2013.01)

(58) Field of Classification Search
None
See application file for complete search history.

(56) References Cited

U.S. PATENT DOCUMENTS

| | | | |
|---|---|---|---|
| 8,481,433 B2 | 7/2013 | Bevan et al. | |
| 9,048,190 B2 | 6/2015 | Tobin et al. | |
| 9,054,048 B2 | 6/2015 | Liu et al. | |
| 9,177,787 B2 | 11/2015 | Guarini et al. | |
| 2004/0086434 A1* | 5/2004 | Gadgil et al. | 422/186.04 |
| 2005/0191848 A1* | 9/2005 | Bencher | 438/624 |
| 2006/0231524 A1* | 10/2006 | Liu et al. | 216/41 |
| 2011/0031216 A1* | 2/2011 | Liao et al. | 216/67 |

* cited by examiner

*Primary Examiner* — Stephanie Duclair
(74) *Attorney, Agent, or Firm* — Moser Taboada; Alan Taboada

(57) ABSTRACT

Embodiments of methods for removing carbon-containing films are provided herein. In some embodiments, a method for removing a carbon-containing layer includes providing an ammonia containing process gas to a process chamber having a substrate with a silicon oxide layer disposed atop the substrate and a carbon-containing layer disposed atop the silicon oxide layer disposed in the process chamber; providing RF power to the process chamber to ignite the ammonia containing process gas to form a plasma; and exposing the substrate to NH and/or $NH_2$ radicals and hydrogen radicals formed in the plasma to remove the carbon-containing layer.

20 Claims, 4 Drawing Sheets

METHODS FOR REMOVING CARBON CONTAINING FILMS

CROSS-REFERENCE TO RELATED APPLICATIONS

This application claims benefit of U.S. provisional patent application Ser. No. 61/877,062, filed Sep. 12, 2013, which is herein incorporated by reference in its entirety.

FIELD

Embodiments of the present disclosure generally relate to semiconductor processing, and more specifically, to methods for removing carbon-containing films or layers during microelectronic device fabrication processes.

BACKGROUND

Conventional techniques to remove carbon-containing films from substrates typically utilize an oxygen-containing plasma (e.g., $O_2$, $CO_2$, or the like) or a pure hydrogen plasma (e.g., $H_2$). However, the inventors have observed that utilizing an oxygen containing plasma causes oxidation and, therefore, an undesirable thickening, of layers underlying the hard mask. Such thickening of the underlying layers may affect the performance of a finished device and/or prevent a desired effective oxide thickness (EOT) from being achieved. Moreover, the inventors have further observed that, when utilizing a pure hydrogen plasma to remove the hard mask, the presence of hydrogen ions in the plasma may cause damage to the underlying layers, further negatively affecting the performance of the finished device.

Thus, the inventors have provided a method for removing an carbon-containing films.

SUMMARY

Embodiments methods for removing carbon-containing films are provided herein. In some embodiments, a method for removing a carbon-containing film includes providing an ammonia containing process gas to a process chamber having a substrate with a silicon oxide layer disposed atop the substrate and a carbon-containing layer disposed atop the silicon oxide layer disposed in the process chamber; providing RF power to the process chamber to ignite the ammonia containing process gas to form a plasma; and exposing the substrate to NH and/or $NH_2$ radicals and hydrogen radicals formed in the plasma to remove the carbon-containing layer.

In some embodiments, a method of forming at least a portion of a CMOS device having a silicon oxide layer with multiple thicknesses includes forming a silicon oxide layer atop the substrate to a first thickness; depositing a carbon-containing layer atop the silicon oxide layer; etching a portion of the silicon oxide layer to reduce the portion of the silicon oxide layer from the first thickness; and removing the carbon-containing layer by: providing an ammonia containing process gas to a process chamber, wherein the substrate is deposed within the process chamber; providing an RF power to the process chamber to ignite the process gas to form a plasma; and exposing the substrate to NH and/or $NH_2$ radicals and hydrogen radicals formed in the plasma to remove the carbon-containing layer.

In some embodiments, a method for removing a carbon-containing film includes providing an ammonia containing process gas to a process chamber having a substrate with a silicon oxide layer disposed atop the substrate and a carbon-containing layer disposed atop the silicon oxide layer disposed in the process chamber; providing RF power to the process chamber to ignite the ammonia containing process gas to form a plasma; flowing the plasma through an ion filter; exposing the substrate to NH and/or $NH_2$ radicals and hydrogen radicals formed in the plasma for a period of time of less than about 200 seconds to remove the carbon-containing layer; pulsing the plasma at a duty cycle of about 2% to about 50% while exposing the substrate to the NH and/or NH2 radicals and the hydrogen radicals to reduce an energy of hydrogen ions formed in the plasma; and heating the substrate to a temperature of about 50 to about 500 degrees Celsius while pulsing the plasma.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
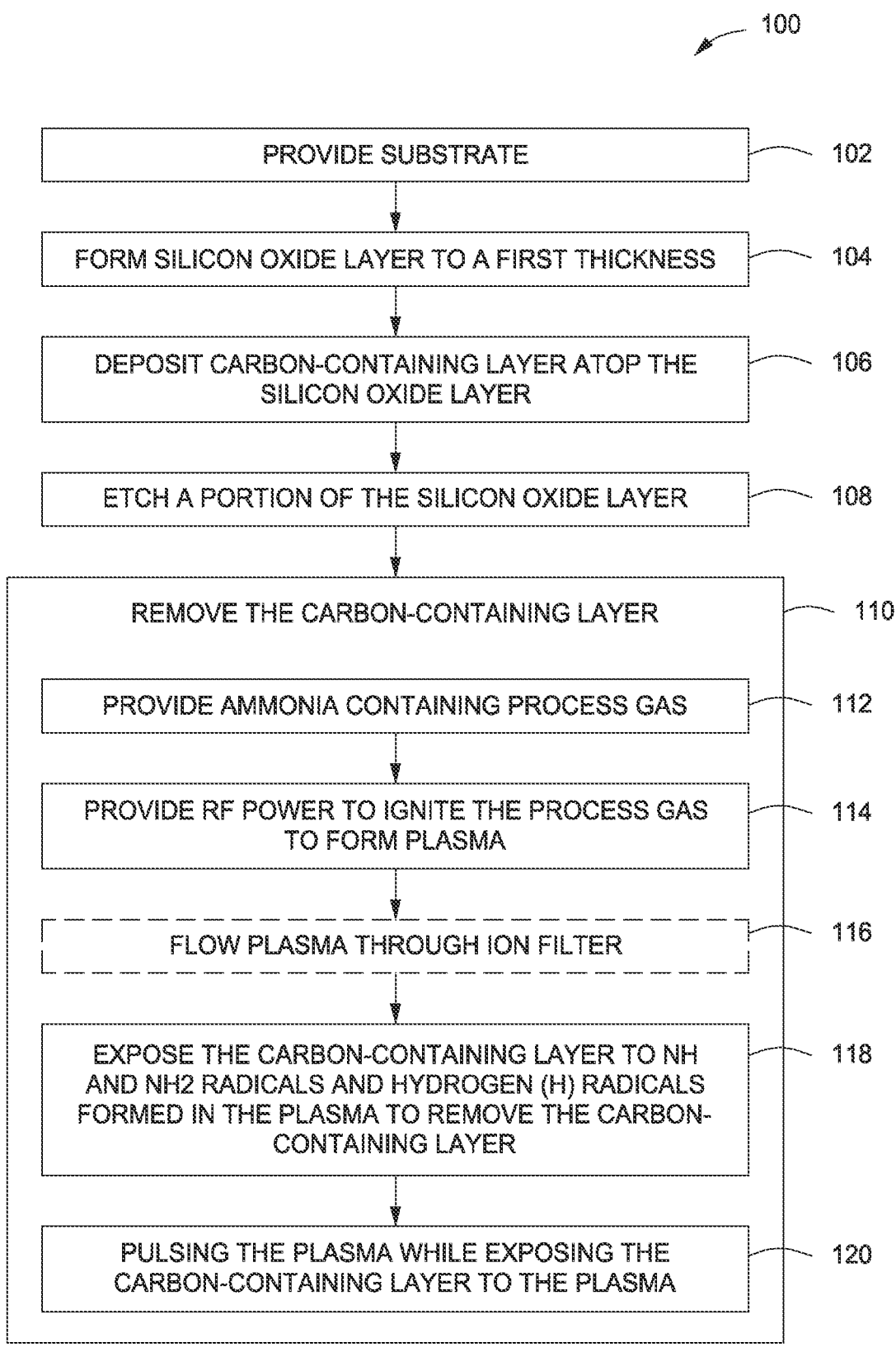
FIG. 1 depicts a method for removing a carbon-containing film in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of methods for removing carbon-containing films are provided herein. In at least some embodiments, the inventive method may advantageously provide a plasma having ions with a lower energy as compared to conventional plasmas utilized for the removal of carbon-containing films or layers. A plasma having ions with a lower energy facilitates the removal of the carbon-containing films while reducing damage to, or not damaging, underlying layers. In addition, the inventive methods may further advantageously provide a plasma having no oxidizing agents, which facilitates the removal of the carbon-containing films while not causing oxidation, and thus thickening, of the underlying layers. While not intending to be limiting, the inventors have observed that the inventive methods may be particularly advantageous in applications such as the fabrication of devices with multiple gate stacks having different effective oxide thicknesses (EOTs), for example, complementary metal oxide semiconductor (CMOS) technology having multiple metal oxide semiconductor field effect transistor (MOSFET) gate oxide thicknesses (e.g., dual $T_{ox}$).

FIG. 1 is a flow chart of a method for removing a carbon-containing film in accordance with some embodiments of the present disclosure. FIGS. 2A-2D depict a portion of a substrate through various stages of the inventive method in accordance with some embodiments of the present disclosure. Although FIGS. 2A-2F depict stages of processing of a two-dimensional (2D) device, the inventive process described herein may also be advantageously used in processing three-dimensional (3D) devices, such as FINFET devices or the like.

The method 100 begins at 102, where a substrate 200 is provided to a process chamber. The process chamber may be any type of process chamber suitable to perform at least a portion of the method described herein, for example, such as the process chamber described below with respect to FIG. 3. In some embodiments, more than one process chamber may be utilized to perform separate portions of the method. In such embodiments, the process chambers may part of an integrated tool (e.g., a cluster tool).

The substrate 200 may be any type of substrate suitable for semiconductor device fabrication. For example, referring to FIG. 2, the substrate 200 may be a silicon substrate, for example crystalline silicon (e.g., Si<100> or Si<111>), silicon oxide, strained silicon, doped or undoped polysilicon, or the like, a III-V or II-VI compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, a semiconductor wafer, or the like.

In some embodiments, the substrate 200 includes one or more partially or fully fabricated semiconductor devices (not shown), for example, such as a two dimensional or three dimensional device, such as a multigate device, fin field effect transistor (FinFET), metal oxide semiconductor field effect transistor (MOSFET), nanowire field effect transistor (NWFET), tri-gate transistor, a memory device such as a NAND device or NOR device, or the like.

In some embodiments, the substrate includes one or more layers, for example, a tunnel oxide layer (not shown). The tunnel oxide layer may comprise any materials suitable for the fabrication of a desired semiconductor device. For example, in some embodiments, the tunnel oxide layer may include silicon and oxygen, such as silicon oxide ($SiO_2$), silicon oxynitride (SiON), or high-k dielectric materials, such as aluminum (Al), hafninm (Hf), or lanthanum (La), zirconium (Zr) based oxides or oxynitrides, or silicon nitrides ($Si_xN_y$), in single or layered structures, or the like.

In some embodiments, the substrate 200 includes a plurality of field isolation regions 204 formed in the substrate 200 to isolate wells having different conductivity types (e.g., n-type or p-type) and/or to isolate adjacent transistors (not shown). The field isolation regions may be shallow trench isolation (STI) structures formed, for example, by etching a trench into the substrate 200 and then filling the trench with a suitable insulator, such as silicon oxide ($SiO_2$), silicon oxynitride (SiON), or the like.

Next, at 104, a silicon oxide ($SiO_2$) layer 206 is formed atop the substrate 200, such as shown at 2B. The silicon oxide ($SiO_2$) layer 206 may be deposited via any process suitable to deposit the silicon oxide ($SiO_2$) layer 206 having desired characteristics (e.g., crystallinity, composition, uniformity, or the like). For example, in some embodiments, the silicon oxide ($SiO_2$) layer 206 is deposited via chemical vapor deposition (CVD), physical vapor deposition (PVD), atomic layer deposition (ALD), epitaxial growth, or the like. In some embodiments, the silicon oxide ($SiO_2$) layer 206 may be formed by first depositing a silicon (Si) containing layer via one of the aforementioned deposition processes, followed by a subsequent oxidation process to form the silicon oxide ($SiO_2$) layer 206.

The silicon oxide ($SiO_2$) layer 206 may be deposited to any thickness 208 suitable to form a desired semiconductor device. For example, in some embodiments, such as applications including multiple gate stacks having different effective oxide thicknesses (EOTs) (e.g., CMOS technology having multiple MOSFET gate oxide thicknesses or dual $T_{ox}$), the silicon oxide ($SiO_2$) layer 206 may be formed to the largest thickness suitable to achieve a higher effective oxide thickness (EOT) and then subsequently partially etched to achieve a low or ultra low effective oxide thickness (EOT), such as the etch described below. As such, in some embodiments, the silicon oxide ($SiO_2$) layer 206 may be formed to a thickness 208 of about 1 to about 5 nm, or in some embodiments, about 2 nm.

Figure 2A:
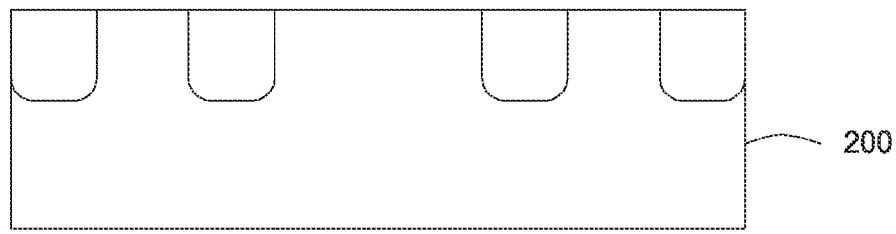
FIGS. 2A-2F depict a substrate in various stages during a method for removing a carbon-containing film in accordance with some embodiments of the present disclosure.
Figure 2B:
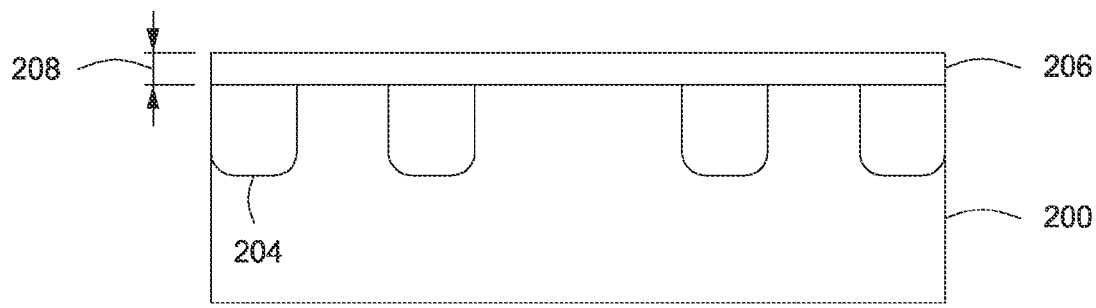
Figure 2C:
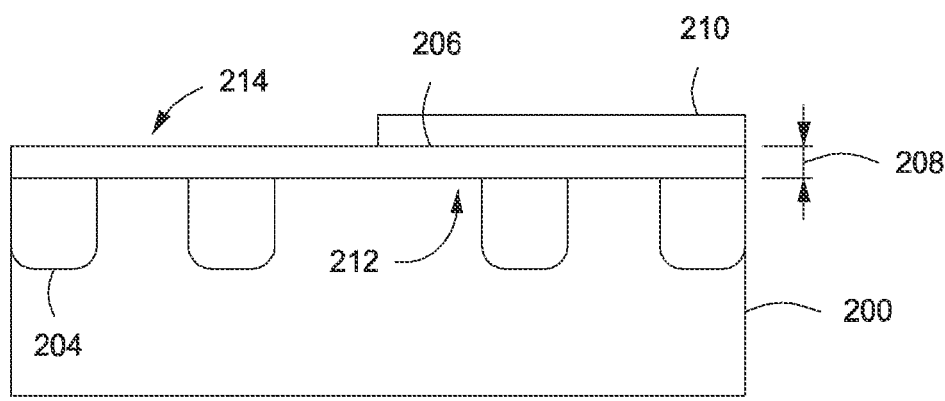

Next, at 106, a carbon-containing film (carbon-containing layer 210) may be deposited atop the silicon oxide ($SiO_2$) layer 206, as shown in FIG. 2C. As used herein, the terms "carbon-containing film" and "carbon-containing layer" are used interchangeably. In some embodiments, the carbon-containing layer 210 is an amorphous carbon hard mask layer. The inventors have observed that a hard mask layer comprising amorphous carbon advantageously provides more control in obtaining a desired thickness of the underlying layers (e.g., the silicon oxide ($SiO_2$) layer 206).

The carbon-containing layer 210 may be deposited via any process suitable to deposit the carbon-containing layer 210 having desired characteristics (e.g., composition, uniformity, or the like). For example, in some embodiments, the carbon-containing layer 210 is deposited via chemical vapor deposition (CVD), physical vapor deposition (PVD), or the like. In some embodiments, the carbon-containing layer 210 is selectively deposited such that a portion 212 of the silicon oxide ($SiO_2$) layer 206 for which the thickness 208 will be maintained is covered by the carbon-containing layer 210, and a portion 214 of the silicon oxide ($SiO_2$) layer 206 for which the thickness will be reduced is exposed, for example, such as shown in FIG. 2C.

Figure 2D:
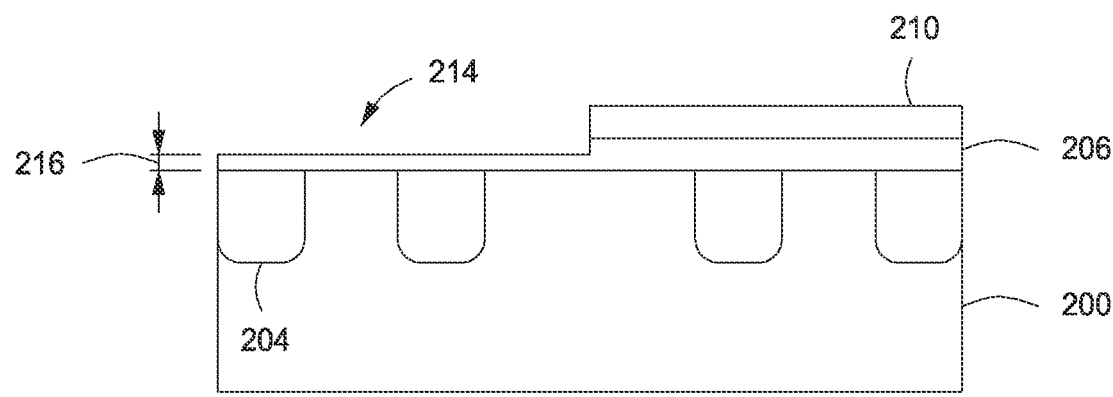

Next, at 108, the portion 214 of the silicon oxide ($SiO_2$) layer 206 is etched to reduce the thickness of the silicon oxide ($SiO_2$) layer 206 to a second thickness 216, such as shown in FIG. 2D. The silicon oxide ($SiO_2$) layer 206 may be etched via any process suitable to accurately remove material from the portion 214 of the silicon oxide ($SiO_2$) layer 206 to achieve the desired second thickness 216. For example, in some embodiments, the silicon oxide ($SiO_2$) layer 206 may be etched via, for example, a dry chemical etch process in a process chamber utilizing SICONI™ technology, available from Applied Materials, Inc. of Santa Clara, Calif.

The second thickness 216 may be any thickness suitable to provide a desired effective oxide thickness (EOT) (e.g., a low EOT or ultra-low EOT) in a finished device. For example, in some embodiments, the second thickness 216 may be about 0.1 to about 1.4 nm. Alternatively, the portion 214 of the silicon oxide ($SiO_2$) layer 206 can be completely removed by etching, and redeposited or regrown to the second thickness 216 subsequent to the removal of the carbon-containing layer 210 (as described below).

Figure 2E:
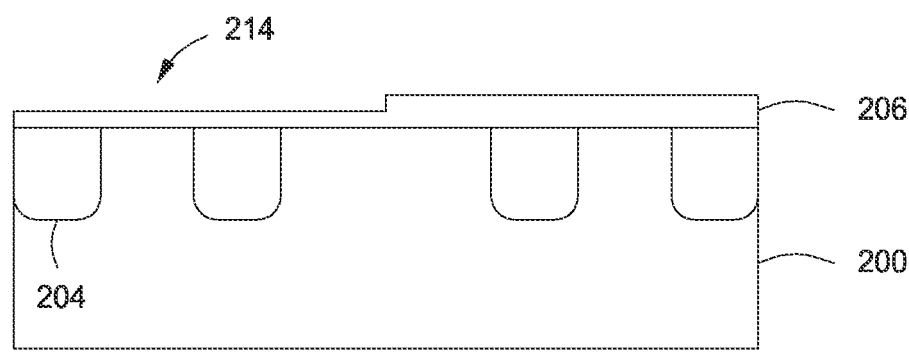

Next, at 110, the carbon-containing layer 210 is removed, such as shown in FIG. 2E. The inventors have observed that conventional techniques to remove amorphous carbon or other carbon-containing films from substrates (e.g., ashing or etching) typically utilize oxygen containing plasma (e.g., $O_2$, $CO_2$, or the like), a hydrogen-containing plasma (e.g., $H_2$), combinations thereof, or the like. However, utilizing an oxygen containing plasma causes oxidation and, therefore, an undesirable thickening, of the underlying layers (e.g., silicon oxide ($SiO_2$) layer 206). Such thickening of the underlying layers may affect the performance of the finished device and/or prevent a desired effective oxide thickness (EOT) from being achieved. Moreover, due to the presence of hydrogen ions in the atomic hydrogen ($H_2$) containing plasma, utilizing a atomic hydrogen ($H_2$) containing plasma may cause damage to the underlying layers (e.g., silicon oxide ($SiO_2$) layer 206).

As such, to remove the carbon-containing layer 210 at 110, first, an ammonia ($NH_3$) containing process gas is provided, at 112. The inventors have observed that, by utilizing an ammonia ($NH_3$) containing process gas, a subsequently formed plasma (e.g., as described below) will have a reduced hydrogen ion density and hydrogen radical concentration as compared to a plasma formed from a pure hydrogen gas ($H_2$). The inventors have observed that providing such a plasma with reduced hydrogen ion density and hydrogen radical concentration, the carbon-containing layer 210 may be removed while reducing or eliminating damage to the underlying silicon oxide ($SiO_2$) layer 206 that would otherwise be caused by the presence of excessive hydrogen ions and/or hydrogen radicals in the plasma. Thus, by controlling active species concentration and energy, the inventive process facilitates removal of carbon-containing films with reduced damage to underlying layers.

The ammonia ($NH_3$) containing process gas may have any amount of ammonia ($NH_3$) suitable to provide a sufficient amount of NH and/or $NH_2$ radicals and hydrogen radicals when formed into a plasma to facilitate the removal of the carbon-containing layer 210. For example, in some embodiments, ammonia ($NH_3$) may be up to about 100% by flow rate (e.g., volume), or in some embodiments about 10% to about 95%, or in some embodiments, about 1 to about 10%, or in some embodiments, or in some embodiments about 2% to about 5%, or in some embodiments, about 2.5%, of the total flow of the ammonia ($NH_3$) containing process gas. In some embodiments, the ammonia ($NH_3$) containing process gas may comprise ammonia ($NH_3$) in the above amounts, with the balance being one or more inert gases, such as at least one of argon (Ar) or helium (He).

In some embodiments, the ammonia ($NH_3$) containing process gas may comprise one or more additional inert gases, for example, such as at least one of argon (Ar) or helium (He). In some embodiments, the ammonia ($NH_3$) containing process gas additionally includes argon (Ar), helium (He), or argon (Ar) and helium (He). When present, the inert gas (such as argon (Ar) and/or helium (He)) may at least partially suppress a formation of hydrogen ions within a plasma formed from the ammonia ($NH_3$) containing process gas, advantageously reducing damage that would otherwise be caused by a greater amount of hydrogen ions within the plasma. As such, the inventors have observed that by adjusting the ratio of ammonia ($NH_3$) to the inert gas (e.g., argon (Ar) and/or helium (He)) within the ammonia ($NH_3$) containing process gas, the density of the hydrogen ions and the concentration of the hydrogen radicals formed within the plasma may be controlled. By controlling the density of the hydrogen ions and the concentration of the hydrogen radicals, damage that would be caused by the excessive hydrogen ions and radicals may be further reduced, or eliminated.

The ammonia ($NH_3$) containing process gas may include any amount of inert gas sufficient to suppress the formation of hydrogen ions within the plasma and/or facilitate a uniform delivery of the ammonia ($NH_3$) containing process gas. For example, in some embodiments, the inert gas may be up to about 99% by flow rate (e.g., volume), or in some embodiments about 5% to about 90%, or in some embodiments about 90% to about 99%, or in some embodiments about 95% to about 98%, or in some embodiments about 97.5% of the total flow of the ammonia ($NH_3$) containing process gas. In some embodiments, the ammonia ($NH_3$) containing process gas consists of, or consists essentially of, ammonia ($NH_3$) and the one or more inert gases, such as argon (Ar) and/or helium (He).

In a non-limiting example of the ammonia ($NH_3$) containing process gas as described above, in some embodiments, an ammonia ($NH_3$) gas may be provided at a flow rate of about 25 sccm and an argon (Ar) gas may be provided at a flow rate of about 475 sccm.

Next, at 114, an RF power is provided to ignite the process gas to form a plasma. Forming the plasma facilitates the formation of ammonia radicals and hydrogen radicals within the process chamber, which may be utilized to remove the carbon-containing layer 210, as described below. The RF power may be provided at any magnitude suitable to form and maintain the plasma and provide the plasma with desired characteristics (e.g., plasma density, uniformity, or the like). For example, in some embodiments, an RF power (e.g., a peak power) of about 500 to about 3000W may be provided to one or more inductive coils disposed proximate the process chamber (e.g., the antennas 312 of process chamber 310 described below) to form the plasma.

In some embodiments, the plasma may be pulsed while the carbon-containing layer 210 is exposed to the plasma, at 120 to reduce the energy of hydrogen ions. As used herein, pulsing the plasma comprises one or more repeating cycles of providing the plasma for a period of time ("on time") followed by a period of time where the plasma is not provided ("off time"). The plasma may be pulsed in any duty cycle sufficient to maintain the plasma while limiting an increase of the ion energy of the hydrogen ions within the plasma. For example, the RF power may be pulsed at a duty cycle of about 2% to about 50%, or in some embodiments, from about 2% to about 10%. The pulsed power advantageously lowers ion energy, with lower duty cycles providing plasma with lower ion energy. The inventors have observed that by adjusting the RF power, the energy of the hydrogen ions formed within the plasma may be controlled. By controlling the energy of the hydrogen ions, damage that would otherwise be caused by the hydrogen ions may be further reduced, or eliminated.

The inventors have observed that while performing the aforementioned plasma pulsing, the energy available to drive the process may be reduced. As such, in some embodiments, the substrate may be heated to a temperature of about 50 to about 500 degrees Celsius, or in some embodiments, about 300 to about 400 degrees Celsius to facilitate adding thermal energy to the process to make up for the reduced ion energy while pulsing the plasma. The increased thermal energy advantageously facilitates breaking the carbon bonds to remove the carbon-containing layer 210. As the inventive processes use radical treatment and thermal reactions, the processes are advantageously conformal along surfaces of 3D devices.

Other process parameters may be utilized to ignite and/or maintain the plasma. For example, in some embodiments, a pressure within the process chamber of about 2 to about 200 mTorr, or in some embodiments, about 20 mTorr.

In some embodiments, next, at 116 the plasma may be optionally flowed through an ion filter to filter out the hydrogen ions formed within the plasma. By filtering out the hydrogen ions, fewer, or in some embodiments, none, of the hydrogen ions formed within the plasma may reach the substrate, advantageously reducing or eliminating damage to the substrate and/or silicon oxide ($SiO_2$) layer 206 that may be caused by the hydrogen ions. The ion filter may be any type of ion filter suitable to reduce or eliminate the presence of hydrogen ions within the plasma, for example, such as the ion filter described below with respect to FIG. 3.

Next, at 118, the carbon-containing layer 210 is exposed to the NH and/or $NH_2$ radicals and hydrogen radicals formed within the plasma to remove the carbon-containing layer 210, such as shown in FIG. 2E. By exposing the carbon-containing layer 210 to the plasma, the NH and/or $NH_2$ radicals and hydrogen radicals formed within the plasma facilitate the removal of the carbon-containing layer 210. The carbon-containing layer 210 may be exposed to the plasma for any amount of time suitable to remove the carbon-containing layer 210. For example, in some embodiments, the carbon-containing layer 210 may be exposed to the plasma for a period of time of less than about 200 seconds, or in some embodiments less than about 60 seconds.

In some embodiments, a bias power may be provided to a substrate support utilized to support the substrate (e.g., the substrate support 316 of process chamber 310 described below) to direct plasma towards substrate. However, the inventors have observed that the addition of too much bias power may increase the ion energy of the hydrogen ions within the plasma, undesirably increasing a possibility of damaging the underlying layers (e.g., the silicon oxide ($SiO_2$) layer 206). As such, in some embodiments, the bias power may be provided for a first period of time to initially reduce a thickness of the carbon-containing layer 210, and then subsequently stopped to facilitate the removal of the carbon-containing layer 210 while not causing damage to the underlying layers (e.g., silicon oxide ($SiO_2$) layer 206).

Figure 2F:
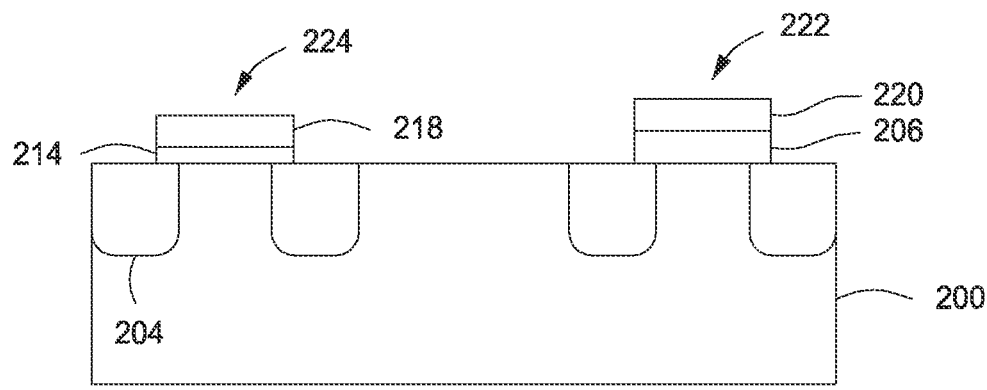

After the carbon-containing layer 210 is removed at 116, the method 100 generally ends and the substrate 200 may proceed for further processing. For example, in some embodiments, additional processes may be performed to at least partially fabricate a desired device (e.g., a metal oxide semiconductor field effect transistor (MOSFET) or the like). For example, in some embodiments, additional processes may be performed to form additional layers 218, 220 (e.g., polysilicon layers, nitride layers, dielectric layers, of the like) to fabricate one or more gate stacks (two partially formed gate stacks 222, 224 shown) to create the device, as depicted in FIG. 2F. In addition to the illustrative example described with respect to FIGS. 2A-2F, the inventive process may also be useful in the fabrication of three-dimensional (3D) structures, such as FINFETs or the like, to provide more uniformity and conformality across the device.

In addition, although described above with respect to one fabrication sequence, the inventive methods described herein can apply to other fabrication sequences as well, including but not limited to, after a dummy gate removal in a replacement gate flow.

Figure 3:
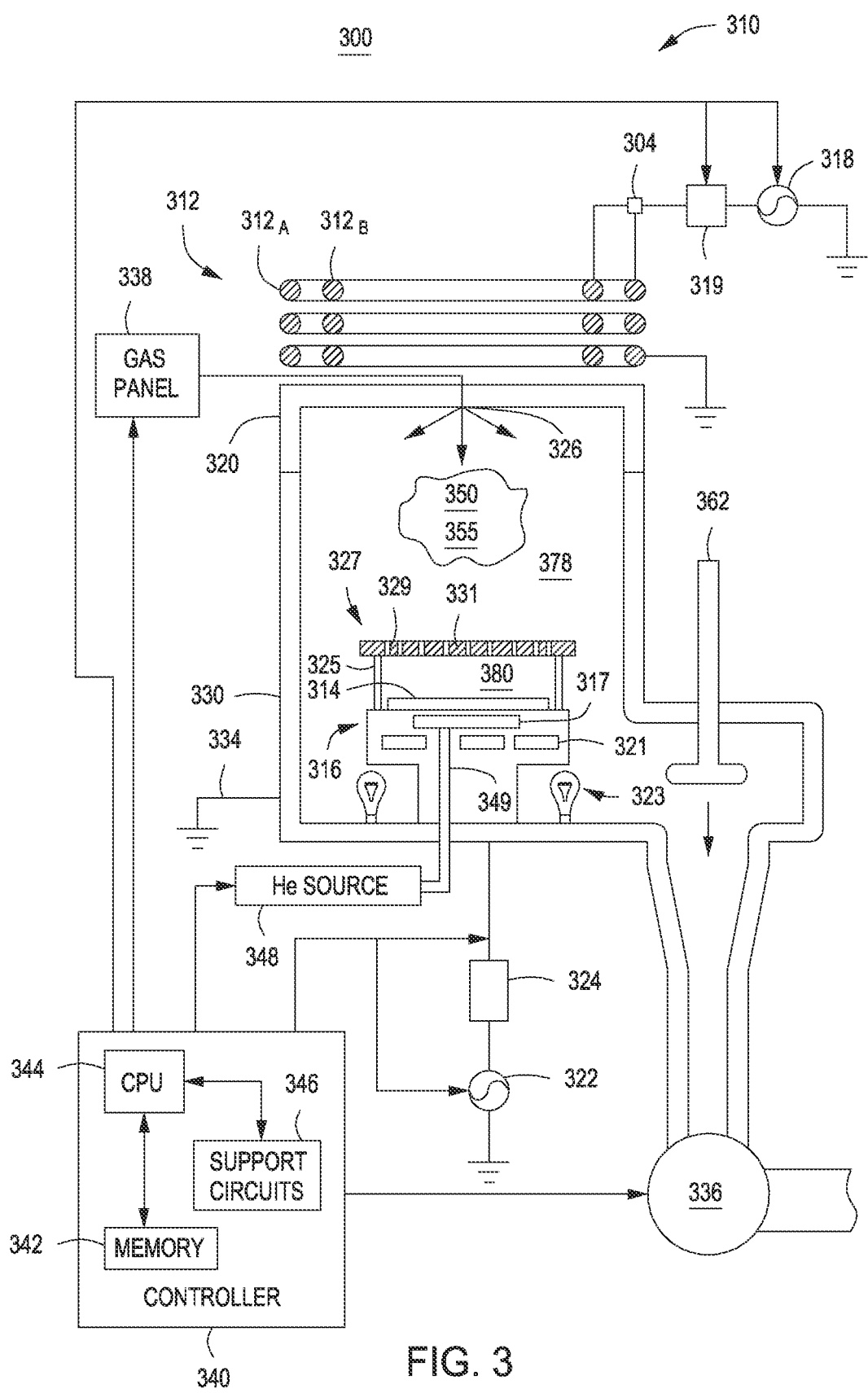
FIG. 3 is a process chamber suitable to perform a method for removing a carbon-containing film in accordance with some embodiments of the present disclosure.

FIG. 3 depicts a schematic diagram of a processing system 300 suitable for performing the method 100. The processing system 300 may be utilized alone or, more typically, as a processing module of an integrated semiconductor substrate processing system, or cluster tool, such as a CENTURA® DPN Gate Stack integrated semiconductor wafer processing system, available from Applied Materials, Inc. of Santa Clara, Calif.

The processing system 300 includes a process chamber 310 having a substrate support 316 disposed within a conductive body (wall 330), and a controller 340. In some embodiments, the substrate support (cathode) 316 is coupled, through a first matching network 324, to a bias source 322.

The bias source 322 generally is a source of up to 500 W at a frequency of approximately 13.56 MHz that is capable of producing either continuous or pulsed power. In other embodiments, the bias source 322 may be a DC or pulsed DC source. In some embodiments, no bias power is provided.

In some embodiments, the process chamber 310 may include a liner (not shown) to line the inner surfaces of the process chamber 310. In some embodiments, the liner may be cooled, for example with coolant channels provided within the liner to flow a coolant therethrough. In some embodiments, the process chamber 310 (and other components exposed to plasma during processing) may be coated with a material that is resistant to the plasma. For example, in some embodiments, the process chamber 310 may be coated with a material that is resistant to attack from the plasma. In some embodiments, the coating may comprise a quartz, or a ceramic material, such as a yttrium oxide ($Y_2O_3$)-based ceramic compositions, aluminum oxide, or the like.

The process chamber 310 may be supplied with a substantially flat dielectric ceiling (ceiling 320). Other modifications of the process chamber 310 may have other types of ceilings such as, for example, a dome-shaped ceiling or other shapes. At least one inductive coil (antenna 312) is disposed above the ceiling 320 (an outer coil $312_A$ and an inner coil $312_B$ shown in FIG. 3). Each antenna 312 is coupled, through a second matching network 319, to a RF power source 318. The RF power source 318 typically is capable of producing up to about 5000 W at a tunable frequency in a range from 2 MHz to 13.56 MHz, and which may produce either a continuous or pulsed plasma. Typically, the wall 330 may be coupled to an electrical ground 334.

In some embodiments, a power divider 304 may be disposed in the line coupling the outer coil $312_A$ and the inner coil $312_B$ to the RF power source 318. The power divider 304 may be utilized to control the amount of RF power provided to each antenna coil (advantageously facilitating control of plasma characteristics in zones corresponding to the inner and outer coils). The dual coil antenna configuration may advantageously provide improved control of nitrogen dosage within each zone.

Optionally, either and/or both of the antennas 312 may be tilted and/or raised lowered with respect to the ceiling 320. The change in position and/or angle of the antenna 312 may be utilized, for example, to change the characteristics, such as uniformity, of a plasma formed in the process chamber.

In some embodiments, an ion filter 327 may be disposed in the process chamber 310 above the substrate support 316 to facilitate reducing or eliminating exposure of the substrate to ions formed within a plasma. The ion filter 327 is electrically isolated from the walls 330 and the substrate support 316 and generally comprises a substantially plate 331 having a plurality of apertures 329. In some embodiments, the ion filter 327 is supported in the process chamber 310 above the pedestal by a plurality of legs 325. The apertures 329 define a desired open area in the surface of the ion filter 327 that controls the quantity of ions that pass from a plasma formed in an upper process volume 378 of the process chamber 310 to a process volume 380 located between the ion filter 327 and the substrate 314. The greater the open area, the more ions can pass through the ion filter 327. As such, the size and distribution of the apertures 329, along with the thickness of the plate 331 controls the ion density in the process volume 380.

In some embodiments, the substrate support 316 may include a chucking device 317 for securing the substrate 314 to the support pedestal during processing. For example, the chucking device 317 may include an electrostatic chuck or a vacuum chuck. The chucking device 317 may facilitate improved heat transfer between the substrate 314 and one or more resistive heaters 321 disposed in the substrate support 316. As illustrated, the one or more resistive heaters 321 may be disposed in the substrate support 316 generally below the position of substrate 314 and configured in multiple zones to facilitate controlled heating of the substrate 314. In some embodiments, the substrate support 316 includes an electrostatic chuck and also includes one or more resistive heaters disposed within or beneath the electrostatic chuck. In some embodiments, the substrate support 316 may not include an electrostatic chuck, but may have one or more resistive heaters disposed proximate a support surface of the substrate support. In such embodiments, the substrate support having the resistive heaters may have a surface coating of, for example, aluminum nitride (e.g., the substrate support may be fabricated from, or may have an outer coating of, aluminum nitride or the like).

In some embodiments, the substrate support 316 may include a resistive heater 321. The resistive heater 321 is coupled to a power source and is capable of maintaining the substrate 314 at a temperature of up to about 500 degrees Celsius.

In some embodiments, one or more radiative sources, such as lamps 323, may be provided to heat the substrate 314. The lamps 323 may be configured similar to radiative lamps utilized in rapid thermal processing chambers. Other heating methods or designs, including heating the substrate from above, may also be used.

The temperature of the substrate 314 may be controlled by stabilizing a temperature of the substrate support 316. A heat transfer gas from a gas source 348 is provided via a gas conduit 349 to channels formed by the back of the substrate 314 and grooves (not shown) in the support surface and/or chucking device 317. The heat transfer gas is used to facilitate heat transfer between the substrate support 316 and the substrate 314. During the processing, the substrate support 316 may be heated by the one or more resistive heaters 321 to a steady state temperature and then the heat transfer gas facilitates uniform heating of the substrate 314. Using such thermal control, the substrate 314 may be maintained at a temperature of about 0 to about 550 degrees Celsius.

In some embodiments, the substrate support 316 may have a low thermal mass for example, to prevent thermal shock to the substrate due to rapid cooling. For example, the substrate support 316 may be configured without a heat sink or cooling plate coupled thereto in order to limit the rate at which heat may be removed from the substrate support 316.

During a typical operation, the substrate 314 (e.g., the substrate 200) may be placed on the substrate support 316 and process gases are supplied from a gas panel 338 through an entry port 326 disposed in the ceiling 320 and centered above the substrate 314. The entry port 326 may include, for example, a baffle or similar gas inlet apparatus that can provide a process gas perpendicularly towards the substrate 314 and radially onward into the process chamber 310. Upon entering the process chamber 310 via the entry port 326, the process gases form a gaseous mixture 350. The gaseous mixture 350 is ignited into a plasma 355 in the process chamber 310 by applying power from the RF power source 318 to the antenna 312. Optionally, power from the bias source 322 may be also provided to the substrate support 316. The pressure within the interior of the process chamber 310 is controlled using a throttle valve 362 and a vacuum pump 336. The temperature of the wall 330 is controlled using liquid-containing conduits (not shown) that run through the wall 330.

The controller 340 comprises a central processing unit (CPU) 344, a memory 342, and support circuits 346 for the CPU 344 and facilitates control of the components of the process chamber 310 and, as such, of nitridation processes, such as discussed herein. The controller 340 may be one of any form of general-purpose computer processor that can be used in an industrial setting for controlling various chambers and sub-processors. The memory, or computer-readable medium, 342 of the CPU 344 may be one or more of readily available memory such as random access memory (RAM), read only memory (ROM), floppy disk, hard disk, or any other form of digital storage, local or remote. The support circuits 346 are coupled to the CPU 344 for supporting the processor in a conventional manner. These circuits include cache, power supplies, clock circuits, input/output circuitry and subsystems, and the like. The inventive method may be stored in the memory 342 as software routine and may be executed or invoked in the manner described above. The software routine may also be stored and/or executed by a second CPU (not shown) that is remotely located from the hardware being controlled by the CPU 344.

Thus, embodiments of methods for removing carbon-containing films have been provided herein. In at least some embodiments, the inventive methods may advantageously facilitate the removal of a carbon-containing film or layer while not affecting, or minimally affecting, underlying layers.

While the foregoing is directed to embodiments of the present disclosure, other and further embodiments of the disclosure may be devised without departing from the basic scope thereof.

The invention claimed is:

1. A method for removing a carbon-containing film, comprising:
   providing a process gas consisting essentially of ammonia and at least one inert gas to a process chamber having a substrate with a silicon oxide layer disposed atop the substrate and a carbon-containing layer disposed atop the silicon oxide layer disposed in the process chamber;
   providing RF power to the process chamber to ignite the ammonia containing process gas to form a plasma; and
   exposing the substrate to NH and/or $NH_2$ radicals and hydrogen radicals formed in the plasma to remove all, or substantially all, of the carbon-containing layer.

2. The method of claim 1, further comprising:
   pulsing the plasma while exposing the substrate to the NH and/or $NH_2$ radicals and the hydrogen radicals to reduce an energy of hydrogen ions formed in the plasma.

3. The method of claim 2, wherein pulsing the plasma comprises pulsing the plasma at a duty cycle of about 2% to about 50%.

4. The method of claim 1, further comprising:
   flowing the plasma through an ion filter prior to exposing the substrate to NH and/or $NH_2$ radicals and hydrogen radicals formed in the plasma.

5. The method of claim 1, wherein the at least one inert gas is argon and/or helium.

6. The method of claim 1, wherein providing the ammonia containing process gas comprises providing ammonia at a flow rate that is about 1% to about 10% of a total flow of the ammonia containing process gas, with the balance of the ammonia containing process gas being one or more inert gases.

7. The method of claim 1, wherein providing the RF power comprises providing about 200 W to about 3000 W of peak RF power.

8. The method of claim 1, wherein exposing the substrate to NH and/or $NH_2$ radicals and hydrogen radicals formed in the plasma comprises exposing the substrate to NH and/or $NH_2$ radicals and hydrogen radicals formed in the plasma for a period of time of less than about 200 seconds.

9. The method of claim 1, further comprising:
heating the substrate to a temperature of about 50 to about 500 degrees Celsius while pulsing the plasma.

10. The method of claim 1, wherein providing the process gas comprises providing the process gas consisting of ammonia and at least one inert gas.

11. A method of forming at least a portion of a CMOS device having a silicon oxide layer with multiple thicknesses:
forming a silicon oxide layer atop a substrate to a first thickness;
depositing a carbon-containing layer atop the silicon oxide layer;
etching a portion of the silicon oxide layer to reduce the portion of the silicon oxide layer from the first thickness; and
removing the carbon-containing layer by:
providing a process gas consisting essentially of ammonia and at least one inert gas to a process chamber, wherein the substrate is disposed within the process chamber;
providing an RF power to the process chamber to ignite the process gas to form a plasma; and
exposing the substrate to NH and/or $NH_2$ radicals and hydrogen radicals formed in the plasma to remove all, or substantially all, of the carbon-containing layer.

12. The method of claim 11, further comprising:
pulsing the plasma while exposing the substrate to ammonia to reduce an amount of hydrogen ions formed in the plasma.

13. The method of claim 11, wherein forming the silicon oxide layer comprises
depositing a silicon layer; and
oxidizing the silicon layer to form the silicon oxide layer to the first thickness.

14. The method of claim 11, wherein the carbon-containing layer is selectively deposited atop the silicon oxide layer.

15. The method of claim 11, further comprising:
flowing the plasma through an ion filter prior to exposing the substrate to NH and/or $NH_2$ radicals and hydrogen radicals formed in the plasma.

16. The method of claim 11, wherein providing the ammonia containing process gas comprises providing ammonia at a flow rate that is about 1% to about 10% of a total flow of the ammonia containing process gas, with the balance of the ammonia containing process gas being one or more inert gases.

17. The method of claim 11, wherein pulsing the plasma comprises pulsing the plasma at a duty cycle of about 2% to about 50%.

18. The method of claim 11, wherein providing the RF power comprises providing about 200 W to about 3000 W of peak RF power.

19. The method of claim 11, wherein providing the process gas comprises providing the process gas consisting of ammonia and at least one inert gas.

20. A method for removing a carbon-containing film, comprising:
providing a process gas consisting essentially of ammonia and at least one inert gas to a process chamber having a substrate with a silicon oxide layer disposed atop the substrate and a carbon-containing layer disposed atop the silicon oxide layer disposed in the process chamber;
providing RF power to the process chamber to ignite the ammonia containing process gas to form a plasma;
flowing the plasma through an ion filter;
exposing the substrate to NH and/or $NH_2$ radicals and hydrogen radicals formed in the plasma for a period of time of less than about 200 seconds to remove all, or substantially all, of the carbon-containing layer;
pulsing the plasma at a duty cycle of about 2% to about 50% while exposing the substrate to the NH and/or $NH_2$ radicals and the hydrogen radicals to reduce an energy of hydrogen ions formed in the plasma; and
heating the substrate to a temperature of about 50 to about 500 degrees Celsius while pulsing the plasma.

\* \* \* \* \*